United States Patent
Tseng et al.

(10) Patent No.: US 7,884,013 B2
(45) Date of Patent: Feb. 8, 2011

(54) DUAL DAMASCENE WITH VIA LINER

(75) Inventors: Uway Tseng, Dongshin Township, Taichung County (TW); Alex Huang, Dongshan Township, Yilan County (TW); Kun-Szu Liu, Sanchong (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 12/154,823

(22) Filed: May 27, 2008

(65) Prior Publication Data

US 2008/0230919 A1    Sep. 25, 2008

Related U.S. Application Data

(62) Division of application No. 11/048,486, filed on Jan. 31, 2005, now Pat. No. 7,387,961.

(51) Int. Cl.
*H01L 21/4763*   (2006.01)
(52) U.S. Cl. .................... 438/639; 438/597; 438/618; 438/675; 257/E21.579

(58) Field of Classification Search ................. 438/618, 438/675, 597, 637, 639; 257/E21.579
See application file for complete search history.

(56) References Cited

U.S. PATENT DOCUMENTS

| 6,140,220 | A  | * | 10/2000 | Lin | ........................ | 438/618 |
| 6,465,888 | B2 | * | 10/2002 | Chooi et al. | ........... | 257/751 |
| 6,878,615 | B2 | * | 4/2005  | Tsai et al. | ............... | 438/618 |

* cited by examiner

*Primary Examiner*—Matthew S Smith
*Assistant Examiner*—John M Parker
(74) *Attorney, Agent, or Firm*—Tung & Associates

(57) ABSTRACT

A dual damascene structure with improved profiles and reduced defects and method of forming the same, the method including forming a first dielectric over a conductive area; forming a first dielectric insulator over the first dielectric; forming a first opening in the first dielectric insulator; lining the opening with a second dielectric; forming a second dielectric insulator over the first dielectric insulator; forming a second opening in the second dielectric insulator overlying and communicating with the first opening; and, filling the first and second openings with a conductive material to electrically communicate with the conductive area.

15 Claims, 5 Drawing Sheets

DUAL DAMASCENE WITH VIA LINER

This application is a Divisional of U.S. patent application Ser. No. 11/048,486, filed Jan. 31, 2005 now U.S. Pat. No. 7,387,961.

FIELD OF THE INVENTION

This invention generally relates to semiconductor device manufacturing methods and more particularly to dual damascene interconnects formed in inter-metal dielectric (IMD) layers and a method of forming the same having a via portion lined with a dielectric via liner also functioning as a trench stop to improve a trench etching process to avoid trench etching induced defects thereby improving device performance and reliability.

BACKGROUND OF THE INVENTION

In forming interconnect wiring structures in integrated circuit manufacturing processes, the trend has been to use low-K dielectric insulating materials together with metal damascenes to increase electrical transport speed and take advantage of the processing advantages inherent in a damascene or dual damascene process.

Low-K materials are now routinely required to reduce signal delay and power loss effects as integrated circuit devices are scaled down. One way this has been accomplished has been to introduce porosity or dopants into the dielectric insulating layer, also referred to as an inter-metal dielectric (IMD) layer.

As a result, the need for lower dielectric constant materials has resulted in the development of several different types of organic and inorganic low-K materials. Several different organic and inorganic low-K materials have been developed and proposed for use in semiconductor devices as insulating materials having dielectric constants less than about 3.5.

One problem with low-K materials has been susceptibility of low-K materials to plasma etching damage during an interconnect formation process, where low-K materials may be damaged in terms of overetching to detrimentally alter opening etch profiles as well as degrading dielectric constant properties. The various problems included in interconnect formation processes with low-K materials are exacerbated in higher aspect ratio openings and in dual damascene formation processes where multiple etching steps are carried in the manufacturing process.

To overcome these problems prior art processes have proposed partially filling the via opening with organic resinous material to form a via plug following the via etching process where the via opening extends through lower and upper dielectric insulating (ILD) layers including a middle etch stop layer. The via plug was intended to protect the via opening during the trench etching process. Several shortcomings, including process complexity and cost are associated with the foregoing process. In addition, other shortcomings such as formation of etch residue fences as the trench/via interface, undesired micro-trenching at the bottom portion of the trench, and difficulty in controlling the level of the via plug, have been associated with such a process.

There is therefore a need in the integrated circuit manufacturing art to develop a more reliable and cost effective dual damascene interconnect and method of forming the same.

It is therefore among the objects of the present invention to provide a more a more reliable and cost effective dual damascene interconnect and method of forming the same, in addition to overcoming other shortcomings of the prior art.

SUMMARY OF THE INVENTION

To achieve the foregoing and other objects, and in accordance with the purposes of the present invention, as embodied and broadly described herein, the present invention provides a dual damascene structure with improved profiles and reduced defects and method of forming the same.

In a first embodiment, the method includes forming a first dielectric over a conductive area; forming a first dielectric insulator over the first dielectric; forming a first opening in the first dielectric insulator; lining the opening with a second dielectric; forming a second dielectric insulator over the first dielectric insulator; forming a second opening in the second dielectric insulator overlying and communicating with the first opening; and, filling the first and second openings with a conductive material to electrically communicate with the conductive area.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

The present invention is directed at a dual damascene and method of forming the same where the dual damascene is formed having a via portion in a first type of low-K IMD layer and the trench line portion is formed in a second type of low-K IMD layer. The present invention is addressed at overcoming problems of forming dual damascenes in low-K materials. The various advantages of the present invention include improving etching process windows, allowing improved control of etching profiles, as well as avoiding damage to low-K materials by plasma etching processes. The dual damascene structure of the present invention and method of forming the same thereby provides an improved dual damascene with improved performance and reliability while reducing a processing cost compared to prior art via plug formation processes.

It will be appreciated that although the dual damascene structure and method of the present invention is particularly beneficial in forming copper filled dual damascenes, other metals may be used as well, such as tungsten, aluminum, and alloys thereof.

For example, referring to FIGS. 1A-1F, in an exemplary embodiment, are shown cross sectional views of a portion of a multi-level semiconductor device at stages in an integrated circuit manufacturing process.

Figure 1A:
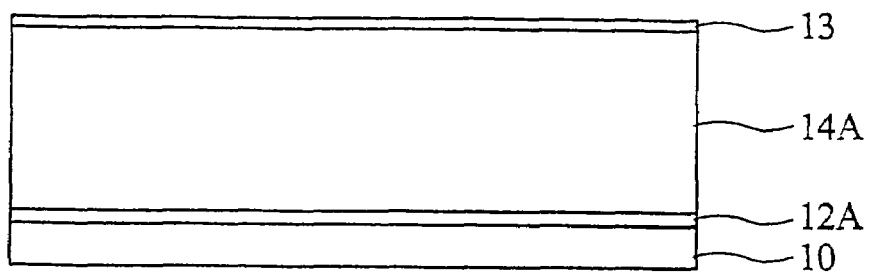
FIGS. 1A-1G are cross sectional views of a dual damascene structure at stages of manufacture according to embodiments of the present invention.

Referring to FIG. 1A, a conductive region 10 is provided as an uppermost material layer in an integrated circuit manufacturing substrate, for example a metal or semiconductor, formed on a semiconductor wafer, formed by conventional processes known in the micro-electronic integrated circuit manufacturing process. An overlying etch stop layer (first dielectric) 12A, is formed on the conductive region 10, for example an upper the etch stop layer preferably formed of silicon nitride (e.g., SiN, $Si_3N_4$), silicon carbide (e.g., SiC), carbon doped silicon oxide, and combinations thereof. In one embodiment, the first dielectric is preferably a nitrogen containing dielectric. The etch stop layer is typically formed to a thickness of about 300 Angstroms to about 700 Angstroms by a conventional CVD, LPCVD, PECVD, or HDP-CVD process.

Still referring to FIG. 1A, formed over first etch stop layer 12A is a first insulating dielectric layer 14A, also referred to as an inter-metal dielectric (IMD) layer, preferably formed of an organic or inorganic silicon oxide based material, more preferably inorganic. For example, preferred materials include fluorinated silicate glass (FSG) and carbon doped silicon oxide. In one embodiment, the first dielectric insulating layer 14A preferably has a dielectric constant of less than about 3.2, e.g., a low-K inorganic silicon oxide based material. In another embodiment, the first insulating dielectric layer 14A is preferably formed by a chemical vapor deposition (CVD) method such as CVD, LPCVD, PECVD, or HDP-CVD process. For example, the first dielectric insulating layer 14A may be formed of BLACK DIAMOND™ (manufactured by Applied Materials) or other inorganic CVD low-K material. Other, suitable, but less preferred low-K inorganic materials include methyl silsesquioxane (MSQ), hydrogen silsesquioxane (HSQ), and fluorine tetra-ethyl-orthosilicate (FTEOS). In one embodiment, the first dielectric insulating layer 14A is preferably FSG for enhanced mechanical strength. An optional organic or inorganic uppermost anti-reflectance coating (ARC), e.g., 13 may be formed over the first dielectric insulating layer 13.

Figure 1B:
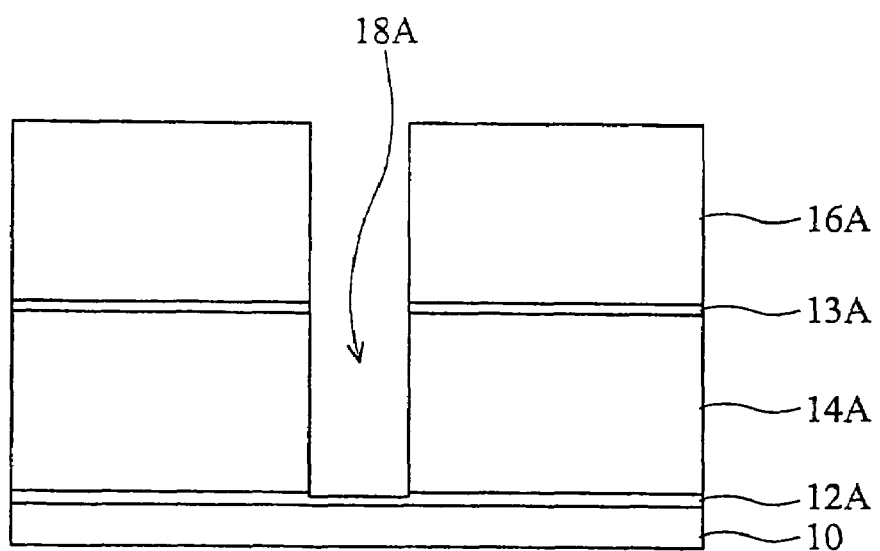

Referring to FIG. 1B, a first photoresist layer 16A is formed over the first IMD layer 14A. The photoresist layer is patterned by a conventional photolithographic patterning process to form a via etching mask. A conventional plasma etching process, such as a reactive ion etch (RIE) process, is then carried out to form a via opening 18A by etching through the first IMD portion 14A to stop on the first etch stop layer 12A, which may include partially etching through a thickness portion of the first etch stop layer 12A. It will be appreciated that the via may be [[a]] circular (i.e., a hole), or rectangular (e.g., a slot). Following via etching, the first photoresist layer 16A is removed according to a conventional chemical stripping or plasma ashing process.

Figure 1C:
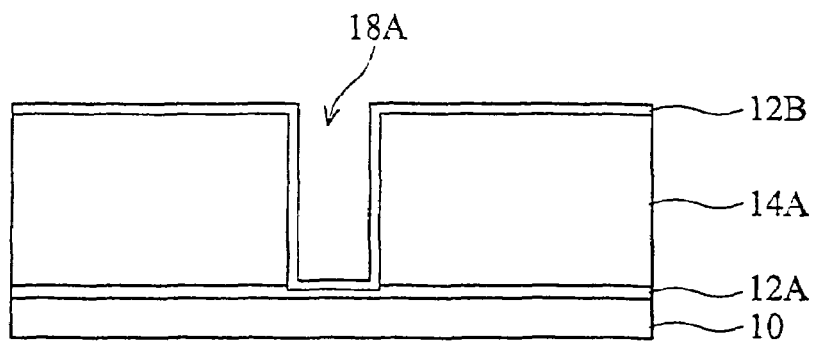

Referring to FIG. 1C, in an important aspect of the invention, following removal of the photoresist layer 16A, and optionally, the ARC layer 13A, an etch stop layer/via liner (second dielectric) 12B is formed over the IMD layer 14A to include lining the sidewalls and bottom portion of the via opening 18A. Preferably, the second etch stop layer/via liner 12B is formed of silicon nitride (e.g., SiN, $Si_3N_4$), silicon oxynitride (e.g., SiON), carbon doped silicon oxide, silicon oxide, and combinations thereof. In one embodiment, the second etch stop layer/via liner 12B is preferably formed of a nitrogen containing dielectric. Preferably, the second etch stop layer/via liner 12B is formed having a thickness of from about 20 Angstroms to about 200 Angstroms and is preferably formed by a chemical vapor deposition (CVD) process, most preferably an atomic layer CVD (ALCVD) process.

Figure 1D:
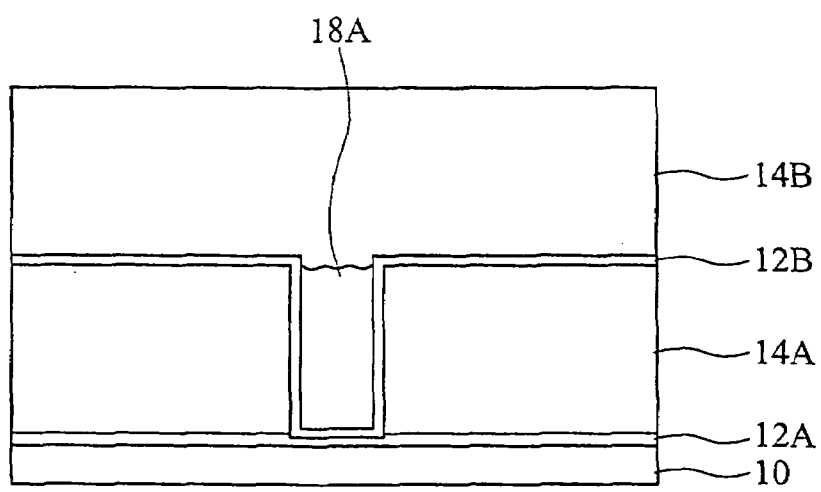

Referring to FIG. 1D, a second dielectric insulating layer (IMD layer) 14B is formed on the process surface including second etch stop layer/via liner 12B. Preferably, the second dielectric insulating layer is formed over the process surface by covering the via opening 18A without filling the opening. For example, a small upper portion of the via opening may be filled by the deposition process of the IMD layer 14B, for example a CVD, PECVD, or HDP-CVD deposition process. The second dielectric insulating layer 14B may be formed of the same or different materials of the preferred materials outlined for the first dielectric insulating layer 14A. In one embodiment, the second dielectric insulating layer is preferably a low-K organic or inorganic material, preferably inorganic, having a dielectric constant of less than about 3.2, for example, carbon doped oxide having a dielectric constant of about 2.4 to about 3.2. By the term 'low-K' is meant a dielectric constant of less than or equal to about 3.2. In one embodiment, only the second dielectric insulating layer 14B is a low-K dielectric material.

Figure 1E:
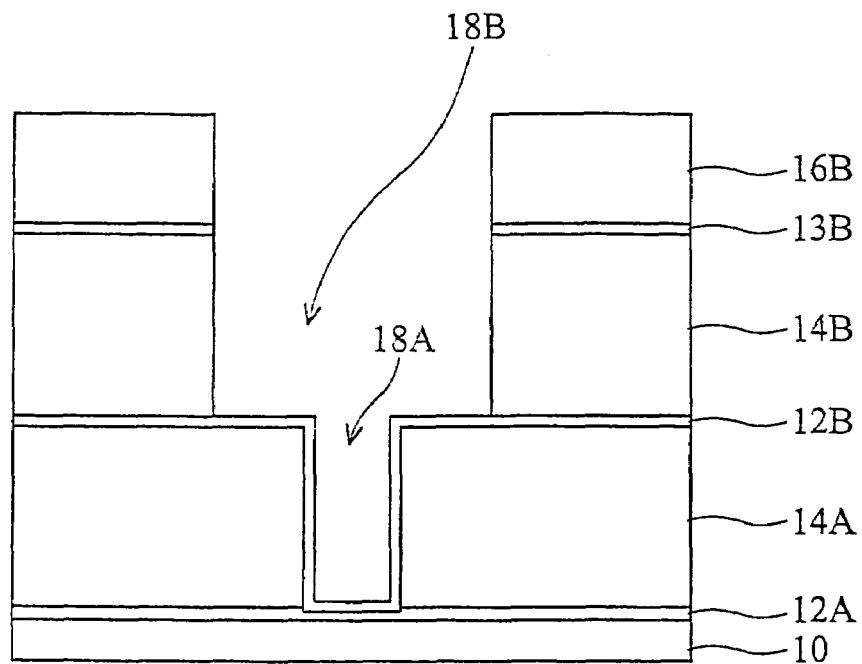

Referring to FIG. 1E, an ARC layer 13B is preferably formed over the second IMD layer 14B. The ARC layer 13A may be formed of an organic or inorganic material but is preferably an inorganic material, for example, formed of one or more of SiN, SiON, SiC, and SiOC. A second photoresist layer 16B is then formed over the process surface and patterned by a conventional photolithographic process to form a trench line etching mask. A trench line opening 18B is the then etched by a conventional plasma etching process (e.g., RIE), through the thickness of the second IMD portion 14B, to stop on the upper portion of the second etch stop/via liner layer 12B. It will be appreciated that the trench line opening 18B may be formed to overlie and encompass more than one via opening.

Figure 1F:
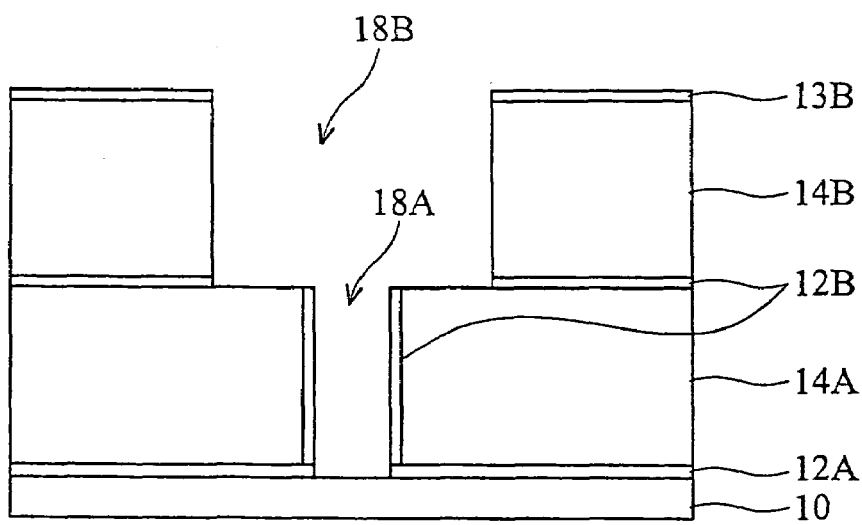

Referring to FIG. 1F, following removal of the second photoresist layer 16B by a stripping process, for example, an in-situ ashing process, the via liner dielectric 12B is plasma etched (e.g., reactive ion etch) to remove the liner portion at the via bottom to expose the underlying conductive region 10. During the photoresist ashing process and the etching process, the first dielectric insulating layer 14A, including the via etch profile is protected and preserved by the via liner 12B. In addition, the etch stop/via liner 12B at the bottom portion of the trench line opening 18B is partially or fully etched through during removal of the liner at the via bottom portion, thereby preserving the dual damascene opening profile at the via/trench opening transition level. It will be appreciated that a portion of the dielectric via liner 12B may remain lining the sidewall portions of the via opening 18A.

Figure 1G:
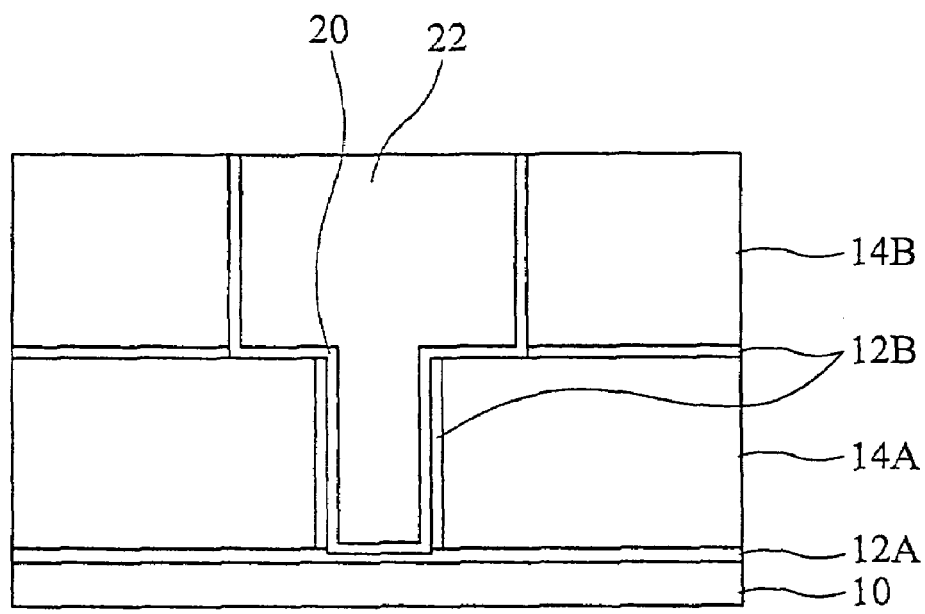

Referring to FIG. 1G, subsequent processes are then undertaken to complete formation of the dual damascene. For example, optional formation of a barrier layer 20 lining the dual damascene opening, followed by conventional processes such as PVD, CVD, or electro-chemical deposition (ECD) methods as are appropriate to fill the dual damascene with metal layer 22, such as aluminum, copper, tungsten, or alloys thereof. A chemical mechanical polish (CMP) process may then be performed to remove metal layer 22 above the dual damascene opening including remaining portions of overlying layers above the IMD layer 14B, e.g., ARC layer 13B, to complete the dual damascene formation process.

Advantageously, according to the present invention, etching profile defects accompanying the trench etching process are avoided, such as formation of etching residue fences at the trench/via interface, as well as undesirable micro-trenching defects at trench bottom portion. In addition, the formation of facets, degrading the etching profile at the trench/via interface are avoided by undesirable overetching during removal of the etch stop layer at the via bottom, a problem in prior art processes. In addition, it has been found that a remaining portion of the via dielectric liner along sidewalls, has the unexpected effect of reducing via induced metal interconnect corrosion (VIMIC) of an underlying conductive material, e.g., copper. Such foregoing advantages improve the performance and device reliability of an integrated circuit semiconductor device as well as decrease processing costs compared to prior art processes including via plug formation processes.

Figure 2:
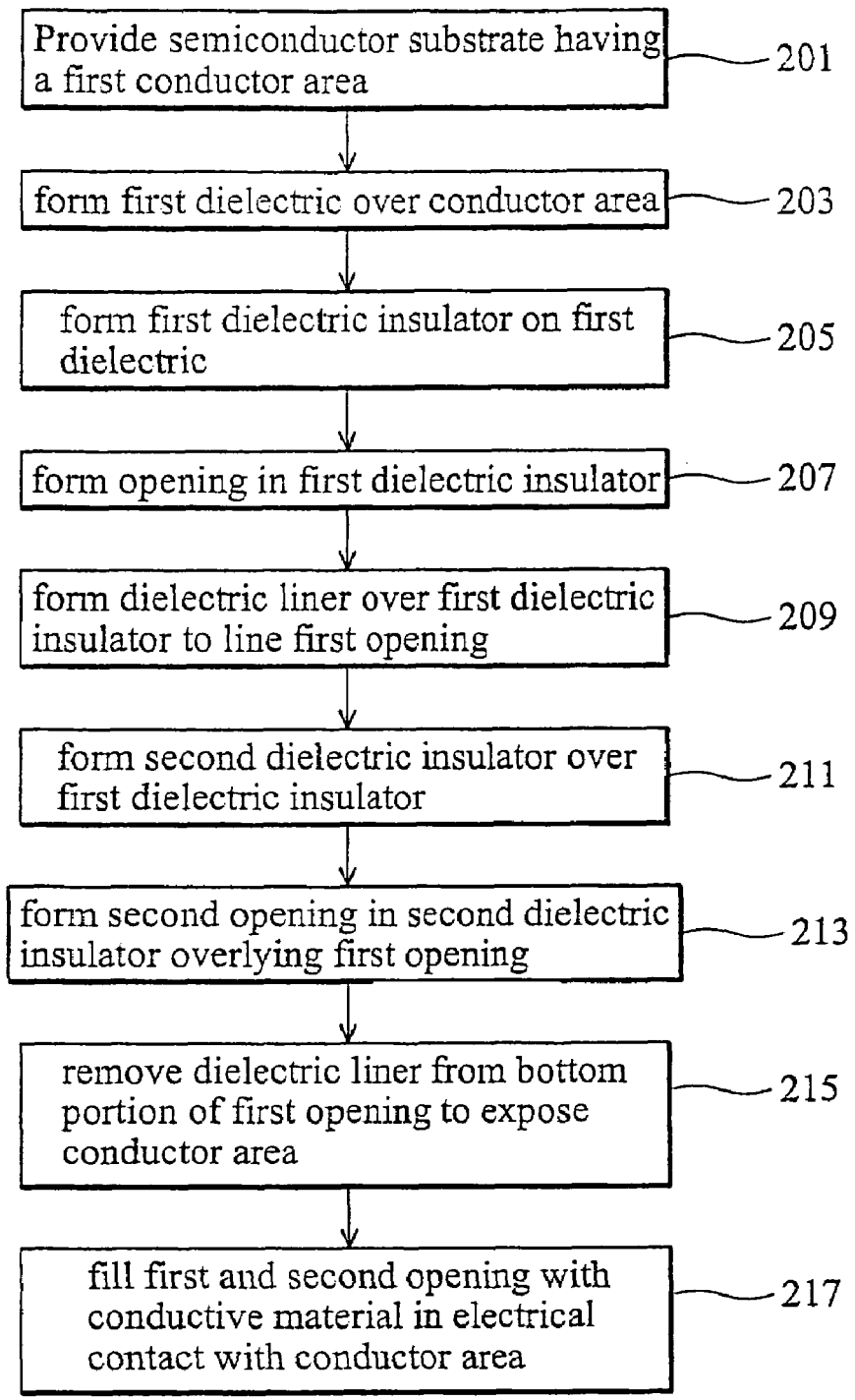
FIG. 2 is a process flow diagram including several embodiments of the present invention.

Referring to FIG. 2 is shown a process flow diagram including several embodiments of the present invention. In process 201, a semiconductor substrate is provided with an exposed conductor area. In process 203, a first dielectric is formed over a conductor area. In process 205, a first dielectric insulator is formed on the first dielectric. In process 207, a via opening is formed through the first dielectric insulator. In process 209, a dielectric liner is formed over the first dielectric insulator to include lining the via opening. In process 211, a second dielectric insulator is formed over the first dielectric insulator. In process 213, a trench opening is formed in the second dielectric insulator overlying the via opening. In process 215, the dielectric liner is removed from a bottom portion of the via opening to expose the conductor area. In process 217, the via and trench opening are simultaneously filled with metal in electrical contact with conductor area.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. An interconnect structure comprising:
   a first dielectric over a conductive area;
   a first dielectric insulator over the first dielectric;
   a first opening in the first dielectric insulator;
   a dielectric liner covering the sidewalls of the first opening;
   a second dielectric insulator over the first dielectric insulator; wherein only said second dielectric insulator of the first and second dielectric insulators comprises a low-K material;
   a second opening in the second dielectric insulator overlying and communicating with the first opening, said dielectric liner disposed between the first and second dielectric insulators and comprising a lowermost sidewall portion of the second opening; and,
   a conductor filling the first and second openings to electrically communicate with the conductive area.

2. The interconnect structure of claim 1, wherein the first and second openings comprise a dual damascene opening.

3. The interconnect structure of claim 1, wherein the first and second dielectric insulators comprise a low-K material.

4. The interconnect structure of claim 1, wherein the first and second dielectric insulators are selected from the group consisting of carbon doped silicon oxide and fluorinated silicate glass (FSG).

5. The interconnect structure of claim 1, wherein the first dielectric and dielectric liner comprise a nitrogen containing dielectric.

6. The interconnect structure of claim 1, wherein the first dielectric comprises a material selected from the group consisting of silicon nitride, silicon carbide, carbon doped silicon oxide, and combinations thereof.

7. The interconnect structure of claim 1, wherein the dielectric liner comprises a material selected from the group consisting of silicon nitride, silicon oxynitride, silicon oxide, carbon doped silicon oxide, and combinations thereof.

8. The interconnect structure of claim 1, wherein the conductor is selected from the group consisting of copper, aluminum, tungsten, and alloys thereof.

9. The interconnect structure of claim 1, wherein the dielectric liner is absent from a bottom portion of the second opening.

10. The interconnect structure of claim 1, wherein the first dielectric and dielectric liner comprise a nitrogen containing dielectric.

11. The interconnect structure of claim 1, wherein the dielectric liner comprises a material selected from the group consisting of silicon nitride, silicon oxynitride, silicon oxide, carbon doped silicon oxide, and combinations thereof.

12. An interconnect structure comprising:
    a first dielectric over a conductive area;
    a first dielectric insulator over the first dielectric;
    a first opening in the first dielectric insulator;
    a dielectric liner covering the sidewalls of the first opening;
    a second dielectric insulator over the first dielectric insulator; wherein only said second dielectric insulator of the first and second dielectric insulators comprises a low-K material;
    a second opening in the second dielectric insulator overlying and communicating with the first opening, said dielectric liner disposed between the first and second dielectric insulators and comprising a lowermost sidewall portion of the second opening, said dielectric liner absent from a bottom portion of said second opening; and,
    a conductor filling the first and second openings to electrically communicate with the conductive area.

13. The interconnect structure of claim 12, wherein the first and second openings comprise a dual damascene opening.

14. The interconnect structure of claim 12, wherein the first and second dielectric insulators comprise a low-K material.

15. The interconnect structure of claim 12, wherein the first and second dielectric insulators are selected from the group consisting of carbon doped silicon oxide and fluorinated silicate glass (FSG).

* * * * *